(12) United States Patent
Kobayashi et al.

(10) Patent No.: US 11,464,150 B2
(45) Date of Patent: Oct. 4, 2022

(54) INFORMATION PROCESSING DEVICE AND INFORMATION PROCESSING METHOD

(71) Applicant: FUJI CORPORATION, Chiryu (JP)

(72) Inventors: Hitoshi Kobayashi, Toyohashi (JP); Junichi Kako, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/980,960

(22) PCT Filed: Apr. 5, 2018

(86) PCT No.: PCT/JP2018/014634
§ 371 (c)(1),
(2) Date: Sep. 15, 2020

(87) PCT Pub. No.: WO2019/193724
PCT Pub. Date: Oct. 10, 2019

(65) Prior Publication Data
US 2020/0413583 A1    Dec. 31, 2020

(51) Int. Cl.
*H05K 13/08* (2006.01)
*H05K 13/04* (2006.01)

(52) U.S. Cl.
CPC ....... *H05K 13/085* (2018.08); *H05K 13/0495* (2013.01)

(58) Field of Classification Search
CPC .................. H05K 13/085; H05K 13/0495
See application file for complete search history.

(56) References Cited

U.S. PATENT DOCUMENTS 10,489,732 B2 * 11/2019 Kitayama .......... G05B 19/4188
10,591,907 B2 *  3/2020 Kobayashi .......... G05B 19/418

2006/0200264 A1    9/2006 Kodama et al.
2016/0170407 A1 *  6/2016 Nakazono .......... G05B 19/41865
                                                        700/99
2016/0196520 A1 *  7/2016 Yamashita ........ G06Q 10/06311
                                                        705/7.13
2016/0353624 A1 * 12/2016 Maezono ............. H05K 13/086

FOREIGN PATENT DOCUMENTS

| JP | H07287730 A | * | 10/1995 |
| JP | 2016-225386 A | | 12/2016 |
| JP | 2017-199772 A | | 11/2017 |
| WO | WO 2005/009101 A1 | | 1/2005 |

OTHER PUBLICATIONS

International Search Report dated Jul. 10, 2018 in PCT/JP2018/014634 filed on Apr. 5, 2018, 1 page.

* cited by examiner

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

The information processing device is a device used in a mounting system configured as a production line including a mounting device configured to mount components on a board. The information processing device comprises: a control section configured to obtain the operator workload to be performed within a time block between a first point-in-time and a second point-in-time based on correspondence information linking work content and operator working time required for the work content, and the production job of the production line; create a workload table linking the time block and the workload; and output the created workload table.

7 Claims, 7 Drawing Sheets

FIG. 3

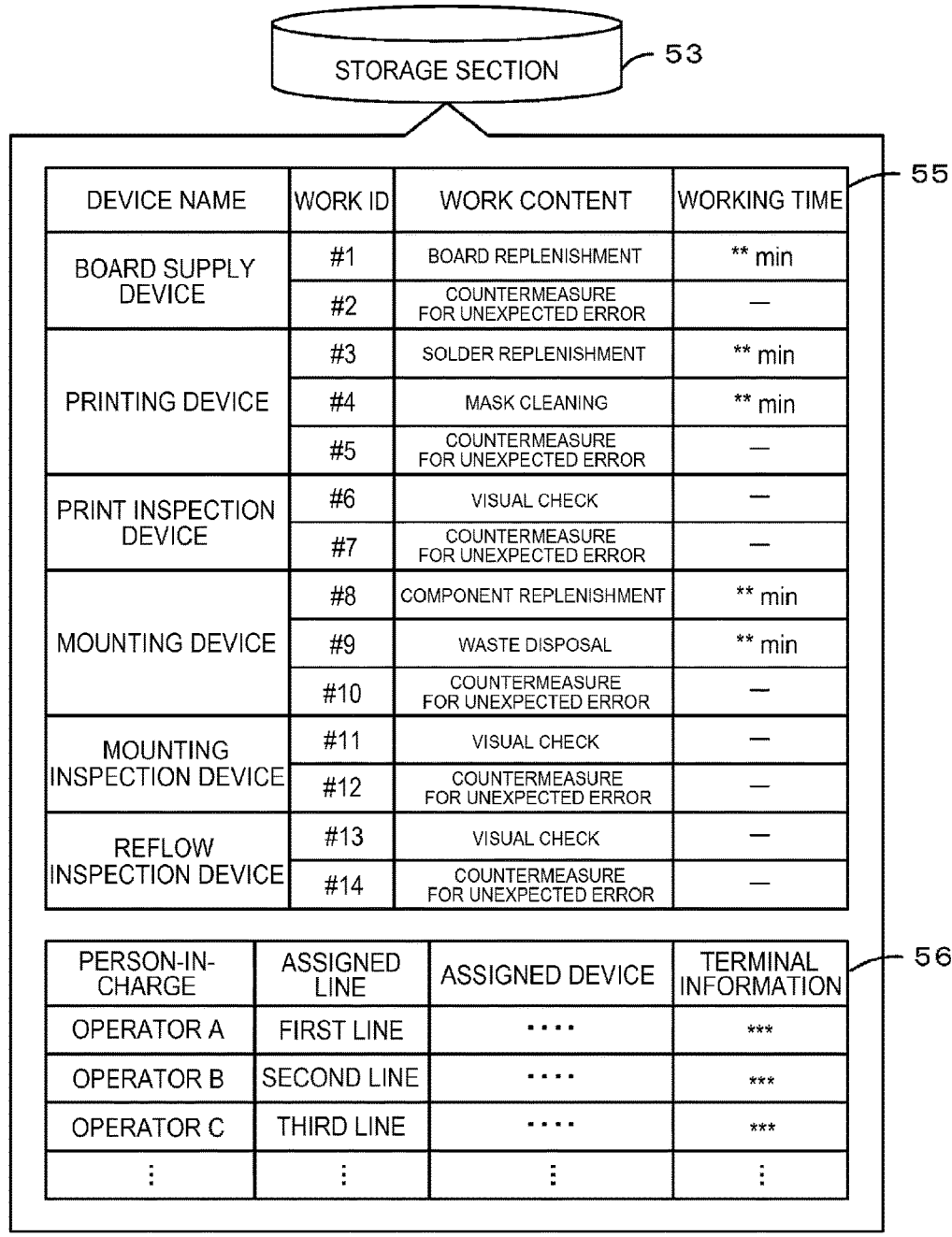

| DEVICE NAME | WORK ID | WORK CONTENT | WORKING TIME |
|---|---|---|---|
| BOARD SUPPLY DEVICE | #1 | BOARD REPLENISHMENT | ** min |
| | #2 | COUNTERMEASURE FOR UNEXPECTED ERROR | — |
| PRINTING DEVICE | #3 | SOLDER REPLENISHMENT | ** min |
| | #4 | MASK CLEANING | ** min |
| | #5 | COUNTERMEASURE FOR UNEXPECTED ERROR | — |
| PRINT INSPECTION DEVICE | #6 | VISUAL CHECK | — |
| | #7 | COUNTERMEASURE FOR UNEXPECTED ERROR | — |
| MOUNTING DEVICE | #8 | COMPONENT REPLENISHMENT | ** min |
| | #9 | WASTE DISPOSAL | ** min |
| | #10 | COUNTERMEASURE FOR UNEXPECTED ERROR | — |
| MOUNTING INSPECTION DEVICE | #11 | VISUAL CHECK | — |
| | #12 | COUNTERMEASURE FOR UNEXPECTED ERROR | — |
| REFLOW INSPECTION DEVICE | #13 | VISUAL CHECK | — |
| | #14 | COUNTERMEASURE FOR UNEXPECTED ERROR | — |

| PERSON-IN-CHARGE | ASSIGNED LINE | ASSIGNED DEVICE | TERMINAL INFORMATION |
|---|---|---|---|
| OPERATOR A | FIRST LINE | .... | *** |
| OPERATOR B | SECOND LINE | .... | *** |
| OPERATOR C | THIRD LINE | .... | *** |
| ⋮ | ⋮ | ⋮ | ⋮ |

INFORMATION PROCESSING DEVICE AND INFORMATION PROCESSING METHOD

TECHNICAL FIELD

In this specification, an information processing device and an information processing method are disclosed.

BACKGROUND ART

Conventionally, for example, a mounting line and a management device for optimizing assignment of operators have been proposed (see, for example, Patent Literature 1) as a mounting system for performing a mounting process. In this mounting system, production record information is acquired, information on events requiring the work of an operator is generated, production capacity is estimated based on information on the arrangement of the mounting lines on the floor and the time required to produce a board and the like, and operators to be assigned are determined.

PATENT LITERATURE

Patent Literature 1: Japanese Patent Application Laid-Open No. 2017-199772

BRIEF SUMMARY

Technical Problem

However, in the mounting system described above, although the number of operators can be determined based on the frequency of component depletion, the working time for replenishing a component, the frequency of errors in which a device stops, the working time for recovering from errors, and the like, as for the workload for each time period in which the mounting process is executed, this has not been considered.

It is an object of the present disclosure to provide an information processing device and an information processing method capable of easily determining the workload for each time period in which a mounting process is executed.

Solution to Problem

The information processing device and the information processing method disclosed herein adopt the following means to achieve the main object described above.

An information processing device for use in a mounting system configured as a production line, including a mounting device configured to mount components on a board, the information processing device comprising: a control section configured to obtain the operator workload to be performed within a time block between a first point-in-time and a second point-in-time based on correspondence information linking work content and operator working time required for the work content, and a production job of the production line; create a workload table linking the time block and the workload; and output the created workload table.

In this information processing device, the operator workload to be performed within the time block between the first point-in-time and the second point-in-time is determined based on correspondence information, in which work content is linked to operator working time required for the work content, and the production jobs of the production lines. Further, the information processing device creates a workload table in which the obtained workloads and the time blocks are linked to each other, and outputs the created workload table. The operator can then check the outputted workload table. Therefore, in this information processing device, the workload table facilitates recognition of the workloads for each time period in which a mounting process is executed.

BRIEF DESCRIPTION OF DRAWINGS

FIG. 3 A diagram showing correspondence information 55 and assignment information 56 stored in storage section 53.

DESCRIPTION OF EMBODIMENTS

Figure 1:
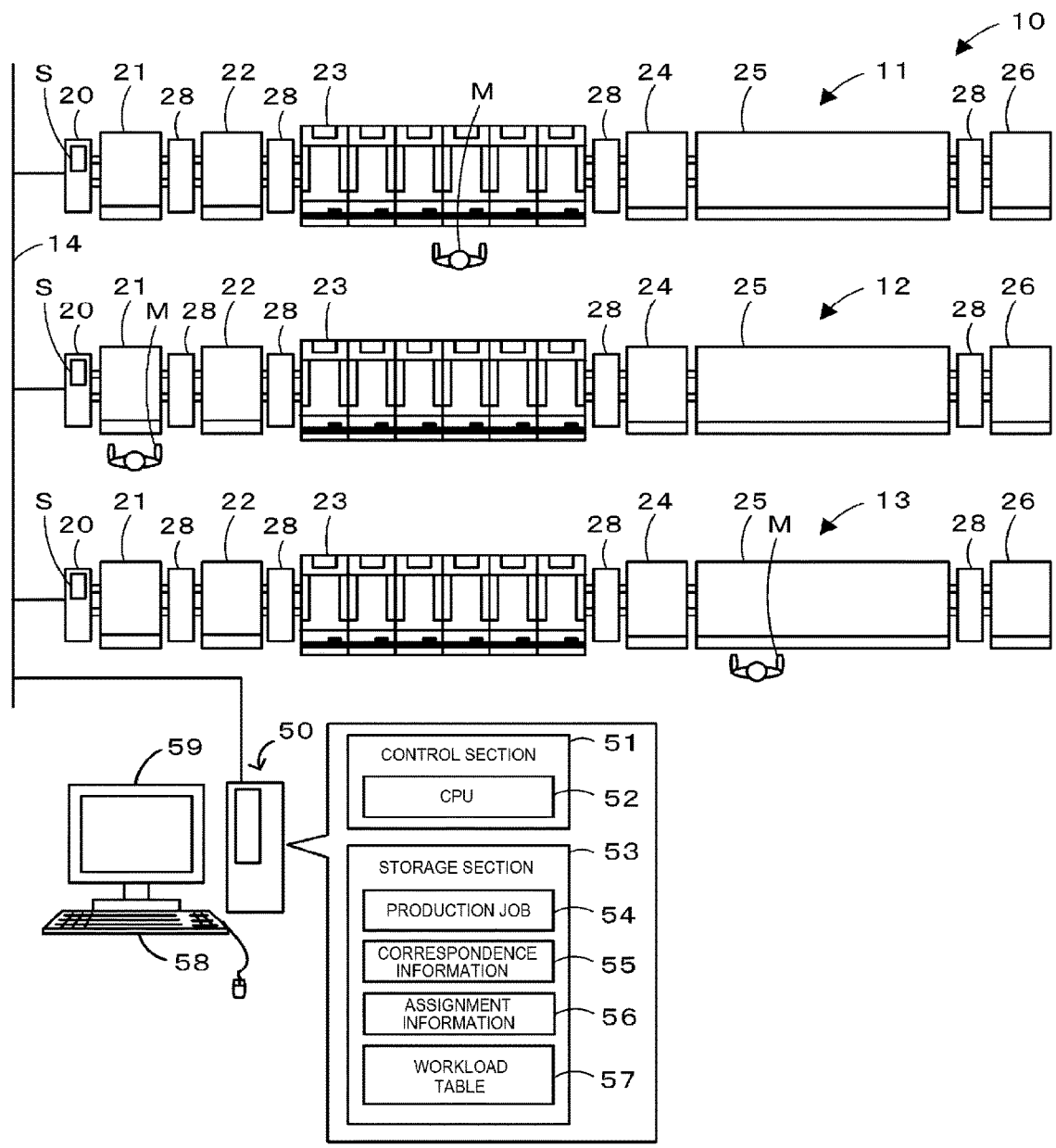
FIG. 1 A schematic diagram showing an example of mounting system 10.
Figure 2:
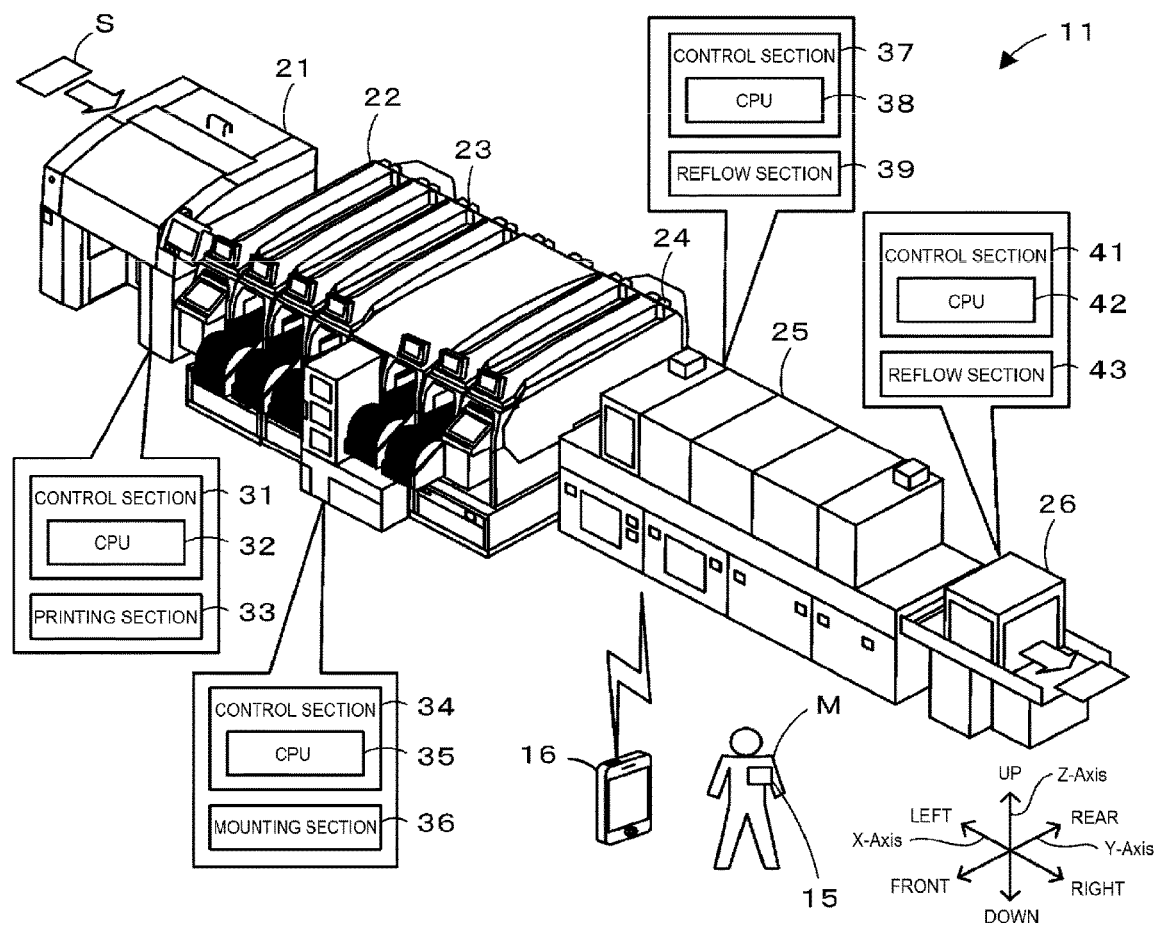
FIG. 2 A diagram of first production line 11.

The present embodiment will be described below with reference to the drawings. FIG. 1 is a schematic diagram showing an example of mounting system 10 of the present disclosure. FIG. 2 is a diagram of first production line 11. FIG. 3 is a diagram of correspondence information 55 and assignment information 56 stored in storage section 53. Mounting system 10 is configured, for example, as a production line in which mounting-related devices, including mounting device 23 for mounting a component on board S that is a mounting target, are arranged. Mounting system 10 includes first production line 11, second production line 12, third production line 13, and management computer (PC) 50. In first production line 11, second production line 12, and third production line 13, multiple mounting-related devices related to the process of mounting components on board S are arranged side by side along the conveyance direction of board S. In mounting system 10, the mounting-related devices and management PC 50 are connected to network 14, such as a LAN, and are configured to exchange information. Mounting-related devices include one or more of, for example, board supplying device 20, printing device 21, print inspection device 22, mounting device 23, mounting inspection device 24, reflow device 25, reflow inspection device 26, conveyance device 28, and the like. Mounting system 10 includes these devices. In the present embodiment, the left-right direction (X-axis), the front-rear direction (Y-axis), and the up-down direction (Z-axis) are as shown in FIG. 2. For convenience of description, the description will mostly focus on first production line 11.

As shown in FIGS. 1 and 2, one or more operators M in charge of each device are assigned to first production line 11. Operator M wears ID card 15, on which information of operator M is stored, and performs various types of work on first production line 11. In first production line 11, by reading information on ID card 15 with a reading device (not shown), it is possible to identify operator M performing work on each first production line 11. Operator M carries portable terminal 16 when performing work on first production line 11. Portable terminal 16 can exchange information with management PC 50 or the like through network 14 and displays information related to first production line 11.

Board supplying device 20 is provided with a rack accommodating board S and is a device for supplying board S to a downstream mounting-related device. When board S is expended, operator M performs an operation of regularly replenishing board S.

Printing device 21, as shown in FIG. 2, is provided with control section 31 and printing section 33. Control section 31 is configured as a microprocessor with a centralized CPU 32 and controls the entire device. Printing section 33 is a unit that executes a printing process of printing solder on board S. Printing section 33 is a unit for applying (printing) solder to board S below through pattern holes in a screen mask by pushing the solder into the pattern holes using a squeegee. When the printing process is continuously executed, operator M regularly performs a solder replenishing operation and a mask cleaning operation. Print inspection device 22 includes an inspection section that executes a print inspection process for inspecting the state of the printed solder. The inspection section is provided with an imaging section movable in the XY direction and inspects the printing state of the solder using an image obtained by imaging board S on which the solder is printed. When an abnormality is detected by the inspection, operator M performs a visual check of board S.

Mounting device 23 includes control section 34 and mounting section 36. Control section 34 is configured as a microprocessor with a centralized CPU 35 and controls the entire device. Mounting section 36 is a unit for picking up a component and mounting the component on board S with a mounting head having a pickup member such as a nozzle attached thereto. Mounting section 36 includes a component supply section, a board processing section, a head moving section, an imaging section, and the like. The component supply section includes a feeder on which a tape holding components is mounted, a tray unit on which components are arranged on a tray, or the like. The board processing section performs the conveyance and fixing of board S. The head moving section moves the mounting head in the XY direction. Imaging section is provided with, for example, a part camera for imaging components picked up by mounting head, a mark camera for imaging a mark on board S, or the like. When the mounting process is continuously executed, operator M performs a replenishing operation of the feeder or tray according to the component usage state and also performs a discarding operation on discarded tape and the like. Mounting inspection device 24 includes an inspection section that executes a mounting inspection process for inspecting the state of components on a board on which the components are mounted. The inspection section is provided with an imaging section movable in the XY direction, inspects the mounting state of the components using an image obtained by imaging board S on which the components are arranged. When an abnormality is detected by the inspection, operator M performs a visual check of board S.

Reflow device 25 includes control section 37 and reflow section 39. Control section 37 is configured as a microprocessor with a centralized CPU 38 and controls the entire device. Reflow section 39 is configured as a heating furnace for heating board S on which components are disposed on solder and is a unit for executing a reflow process on board S. Reflow inspection device 26 includes control section 41 and inspection section 43. Control section 41 is configured as a microprocessor with a centralized CPU 42 and controls the entire device. Inspection section 43 is a unit for final inspection of the state of components on board S based on an image obtained by imaging board S which has undergone the reflow process.

Conveyance device 28 is a unit for conveying board S. Conveyance device 28 is a unit for conveying board S with a pair of conveyor belts laid down apart from each other.

Management PC 50 (see FIG. 1) is configured as a server for managing information of each device of mounting system 10. Management PC 50 includes control section 51, storage section 53, input device 58, display section 59, and a communication section (not shown). Control section 51 is configured as a microprocessor with a centralized CPU 52. Control section 51 exchanges information with external devices in addition to input device 58 and display section 59. Input device 58 is, for example, a device such as a mouse or a keyboard for receiving instructions from operator M. Display section 59 is a liquid crystal display for displaying a screen. Management PC 50 exchanges data with devices in the production lines connected to network 14. For example, management PC 50 acquires the state of solder consumption from printing device 21; the state of consumption of components, accommodated in feeders, from mounting device 23; inspection results from each inspection device; and the like via the communication section. Further, management PC 50 receives error information and the like from each device via the communication section.

Production job 54, correspondence information 55, assignment information 56, and the like are stored in storage section 53. Production job 54 includes, for example, information such as which component is to be disposed at which position on board S of mounting device 23 included in a predetermined production line. As shown in FIG. 3, correspondence information 55 is information in which work content for each device and operator working time required for this work content are linked. In this correspondence information 55, device type, work ID, work content, and working time are linked. The working time is a value obtained empirically as the time required for operator M to perform the work content and is a fixed value but can be changed. Assignment information 56 is information linking an operator with the device of mounting system 10 which the operator is in charge of. In this assignment information 56, the name of the operator, the main assigned production line, the assigned device, and information regarding the terminal to be carried. In this assignment information 56, three operators A to C are assigned to the first to third production lines, respectively. Management PC 50 can search for portable terminal 16 of operator M in-charge using assignment information 56, for example, when an abnormality occurs in the device. Workload table 57 is a table in which the workload of operator M to be performed within a time block between a first point-in-time and a second point-in-time is linked with the time block. By checking workload table 57, it is possible to estimate the relationship between the time points of each production line and inability for work to take place. This workload table 57 includes workload table 62 and workload table 72, which will be described later.

Figure 4:
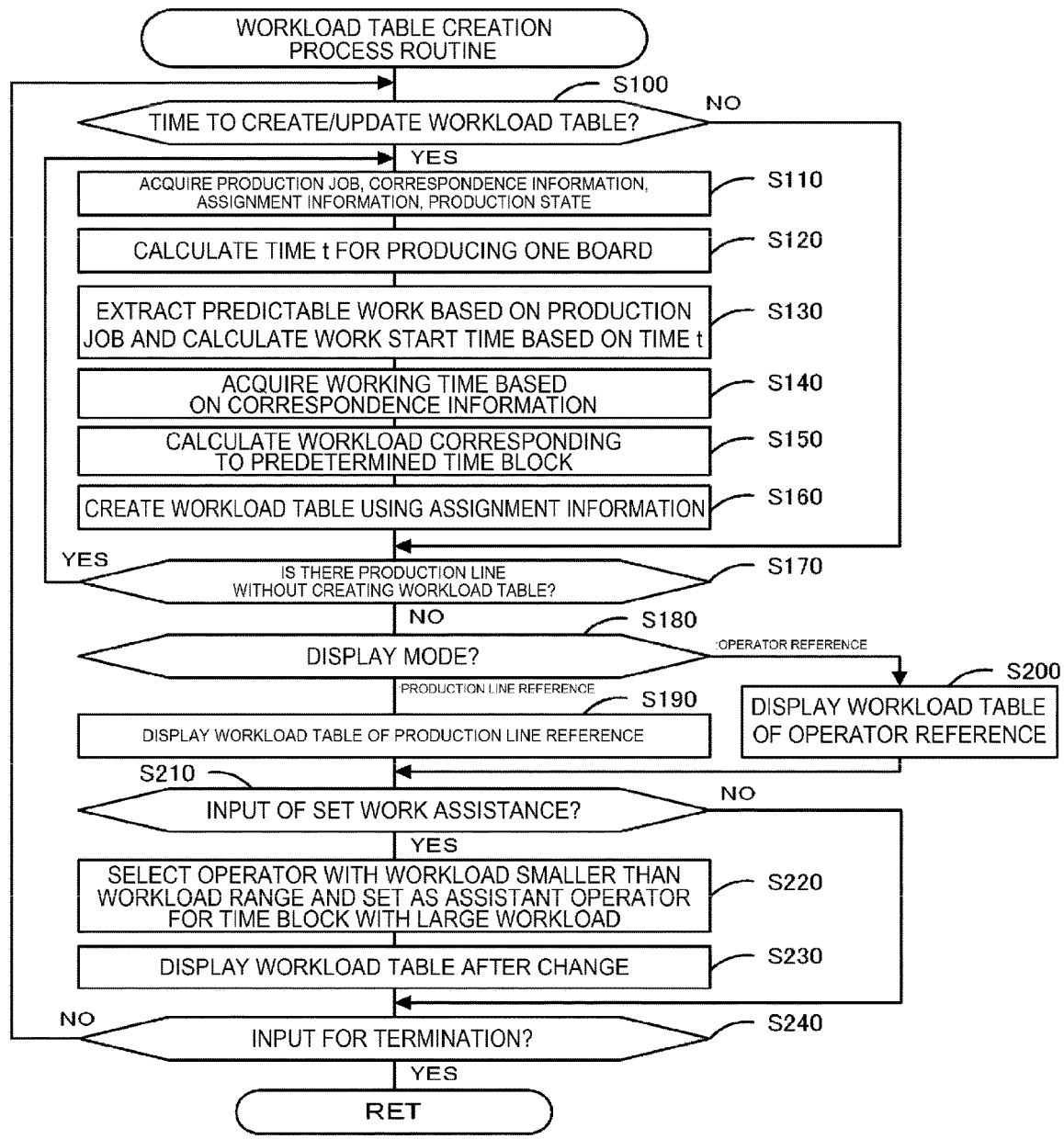
FIG. 4 A flowchart showing an example of a workload table creation process routine.

Next, the operation of mounting system 10 of the present embodiment configured in this manner will be described. FIG. 4 is a flowchart showing an example of a workload table creation process routine executed by CPU 52 included in control section 51 of management PC 50. This routine is stored in storage section 53 of management PC 50 and is executed after booting up mounting system 10. Upon starting this routine, first, CPU 52 of management PC 50 determines whether it is time to of create or update the workload table (S100). The time for the creation may be set at the start of this routine, and the time for the update may be set after a predetermined amount of time (e.g., 30 minutes, 1 hour, etc.) has elapsed since the previous creation or update. At the time of creation or updating of the workload table, CPU 52 performs the following workload table creation process (S110-S160). Here, the workload table of first production line 11 will be described as a specific example, but CPU 52 also executes the same workload table creation process for second production line 12 and third production line 13.

First, CPU 52 reads and acquires production job 54, correspondence information 55, and assignment information 56 from storage section 53 and acquires production status information from each of the production lines (S110). The production status information refers to information including progress status, such as the number of boards S produced thus far. When a new workload table is created, production is not yet started, and the production status is zero. Next, CPU 52 calculates time t for producing one board S (S120). Time t is calculated on based on the number of components included in production job 54, the movement to the arrangement positions, and the like. Next, CPU 52 extracts work sessions that can be predicted based on production job 54 and calculates start times of the work sessions based on time t (S130). CPU 52 can calculate, for example, the amount of solder paste consumption, the amount of components consumed per unit of time, and the like from time t of one board S. Therefore, CPU 52 can calculate the start times of work sessions such as the work of replenishing solder paste, the work of cleaning screen masks, the work of replenishing components (i.e., the work of replacing feeders), and the work of discarding waste.

Figure 5:
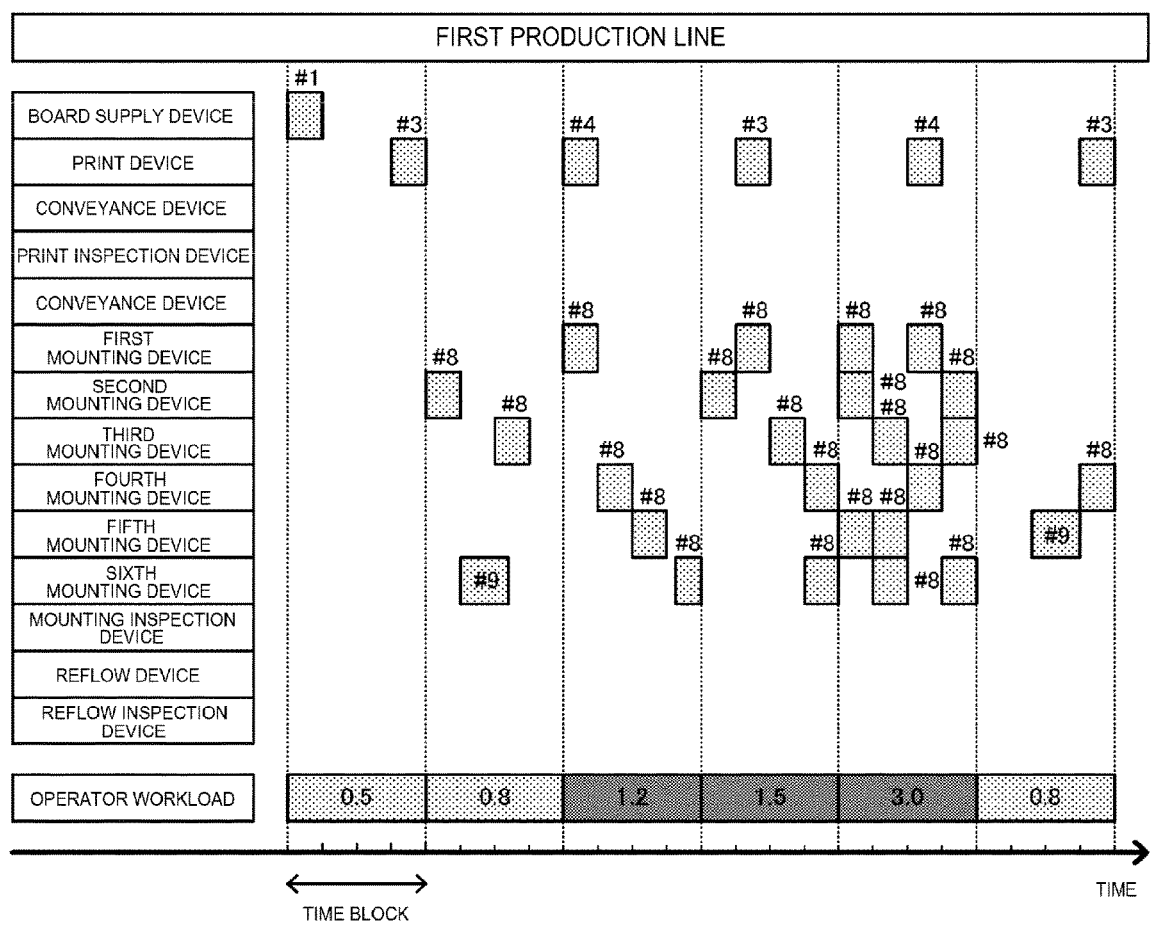
FIG. 5 A diagram showing a work step table showing the work schedule and the working times of the first production line.

Next, CPU 52 acquires working times based on correspondence information 55 (S140) and calculates the workloads corresponding to the predetermined time blocks (S150). After obtaining the start times of work sessions, CPU 52 creates a work step table in which the working times required for each work session are linked with each work session. Here, a time block may be, for example, the time during which the workload can be easily understood and may be, for example, 10 minutes or 30 minutes. Further, a workload may be, for example, a ratio of the working time to the length of the time block. For example, when 10 minutes is defined as the length of the time block and working time is 5 minutes, the workload is indicated as 0.5. FIG. 5 is a diagram showing an example of a work step table indicating the work schedule and the working times of first production line 11. In FIG. 5, working times are indicated by shaded blocks, and work IDs are attached to the shaded blocks. CPU 52 creates a work step table from each of the work start times and working times for each device and obtains the workload for each time block.

When the workloads are calculated, CPU 52 creates a workload table using assignment information 56 (S160). CPU 52 creates a workload table (see FIG. 6) in which workloads are linked to each production line, and a workload table (see FIG. 8) in which workloads are linked to each operator. A workload table is a table that links workloads, operators M, and time blocks, wherein each workload is to be performed within the corresponding time block. When the workload table is created, CPU 52 determines whether there is a production line for which a workload table has not been created (S170), and when there is a production line for which a workload table has not been created, the processes from S110 onward are repeatedly executed. On the other hand, when there is no production line for which a workload table has not been created in S170, that is, when workload table 62 has been created for all production lines, CPU 52 determines whether the displayed mode is the production line reference or the operator reference (S180). CPU 52 may be made to acquire a display mode set in advance by operator M and execute this setting. When the display mode is the production line reference, the workload table of the production line reference is displayed (S190).

Figure 6:
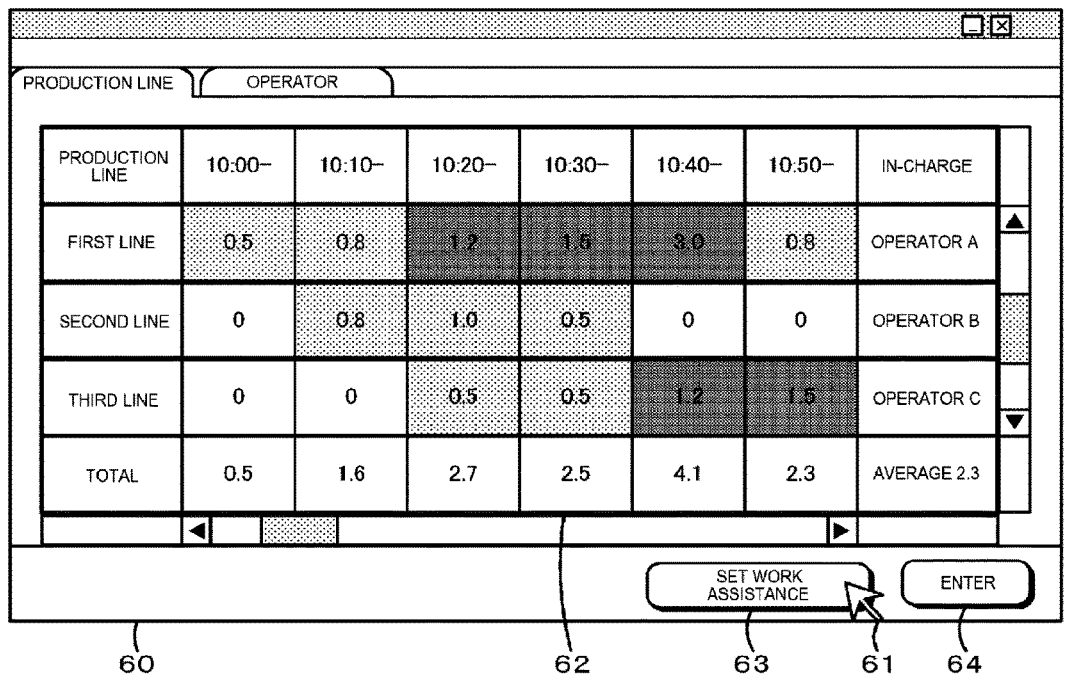
FIG. 6 A diagram showing an example of workload table display screen 60 of a production line reference.

FIG. 6 is a diagram showing an example of workload table display screen 60 of the production line reference, which is displayed on display section 59. Workload table display screen 60 includes cursor 61, workload table 62, set work assistance key 63, and enter key 64. Cursor 61 is operated by operator M when selecting information. Workload table 62 is a table in which the workload of operator M to be performed within a time block and the corresponding time block are linked for each production line. Workload table 62 displays workloads that are within a predetermined workload range that operator M works, workloads that are smaller than the predetermined workload range, and workloads that are larger than the predetermined workload range in different ways. Here, the "predetermined workload range" may be, for example, a range of working times suitable for normal work for operator M. A workload range may be, for example, a ratio of working time of the operator to the time block, and may be a range from 0.2 to 0.8, a range from 0.1 to 1.0, or the like. Specifically, when the time block is 10 minutes and the working time is 10 minutes, the workload is 1.0 and the operator can work within the time block. On the other hand, when the time block is 10 minutes and the working time is 15 minutes, the workload becomes 1.5, and it can be understood that the workload in the time block is large. Here, the predetermined workload range is defined to be 0.1 or more and 1.0 or smaller, and the display mode for workload table 62 is set so that workloads smaller than 0.1 and workloads more than 1.0 visually stand out. Operator M can visually recognize that there is some margin with respect to time when a workload is smaller than 0.1 and that the work cannot be completed within that time when the workload is larger than 1.0. In workload table 62, the total value of the workloads of all the lines and the average value thereof are displayed at the bottom. By checking this total value, operator M can check in which time period the workload is large. By checking the average value, operator M can check whether the number of operators currently assigned is appropriate for the number of operators required for all the production lines. Set work assistance key 63 is a key to be pressed when workload is to be automatically equalized. Enter key 64 is a key that is pressed to enter a current selection or the result of a change.

Figure 7:
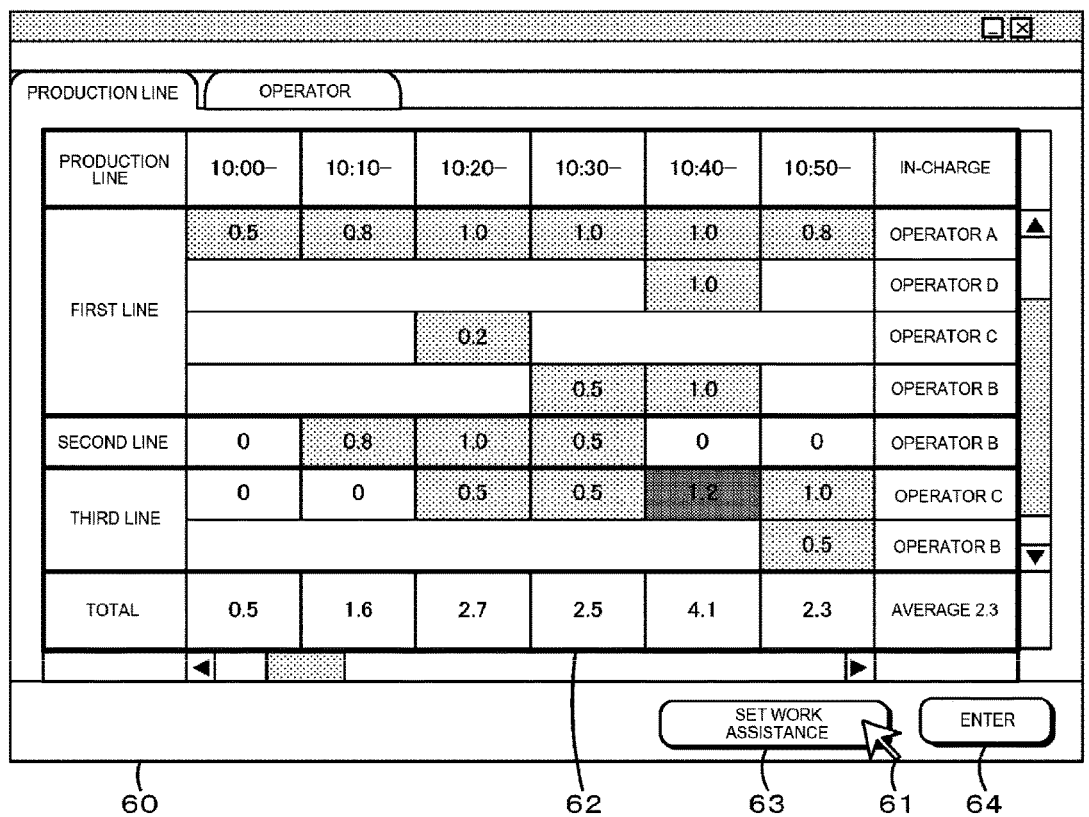
FIG. 7 A diagram showing an example of workload table display screen 60 after setting assistants.

After S190, CPU 52 determines whether the work assistance setting has been inputted based on whether set work assistance key 63 has been pressed (S210). When the work assistance setting is inputted, CPU 52 selects an operator who has a workload smaller than the predetermined workload range in a time block in which the workload is large, sets the operator as an assistant operator (S220), and displays the workload table after the change (S230). That is, when there is a production line with a time block in which the workload is larger than the predetermined workload range, CPU 52 selects an operator who has a workload smaller than the workload range of the time block, and sets the selected operator as an assistant operator of the production line in which workload is larger than the predetermined workload range. FIG. 7 is a diagram showing an example of workload table display screen 60 after the assistant operator is set. CPU 52 sets an operator who has a workload smaller than 1.0 as an assistant operator in a time block in which the workload is larger than 1.0, thereby performing a process of making the workload of the time block equal to or less than 1.0. For example, operator M who is in charge of another production line and has a small workload is assigned as an assistant operator, and at this time, the position of operator M (i.e., the position in the production line to which the operator's main responsibility lies) is also taken into consideration and set. For example, at 10:30 in workload table 62 of FIG. 6, although both operators B,C have the same workload, 0.5, since second production line 12, is closer to first production line 11, operator B is set as assistant operator for first production line 11 (FIG. 7). It should be noted that when enter key 64 is pressed, CPU 52 sets the contents of changed workload table 62 and outputs the information to portable terminal 16 of the operator in charge. In this manner, CPU 52 can equalize the workload of operators by assigning operators from other production lines as assistant operators.

Figure 8:
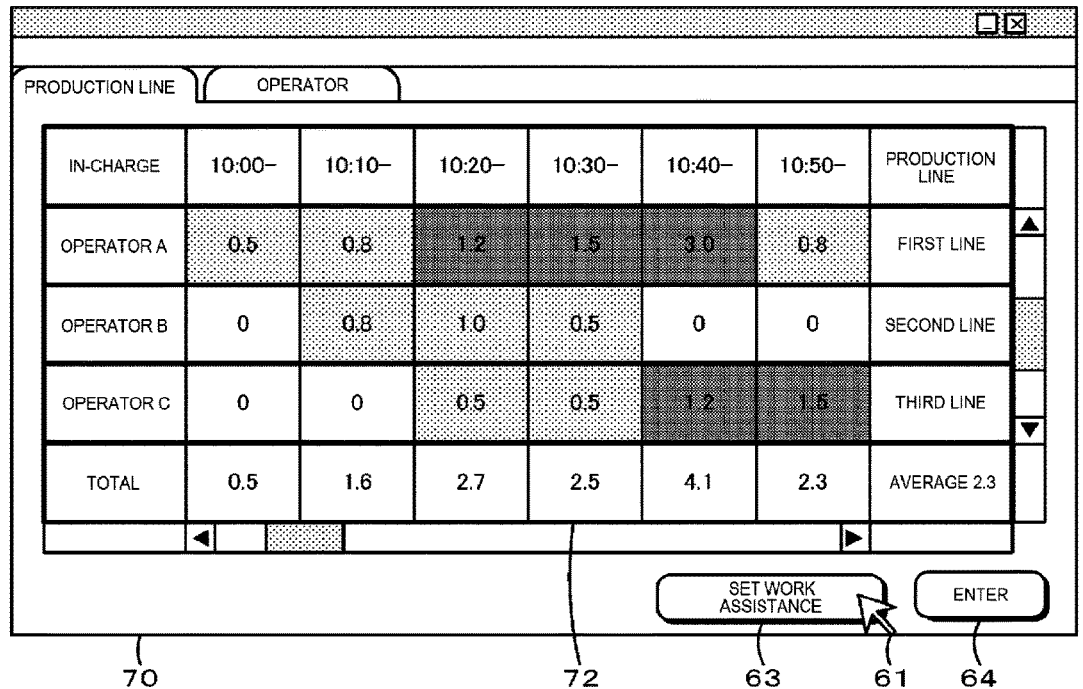
FIG. 8 A diagram showing an example of workload table display screen 70 of an operator reference.
Figure 9:
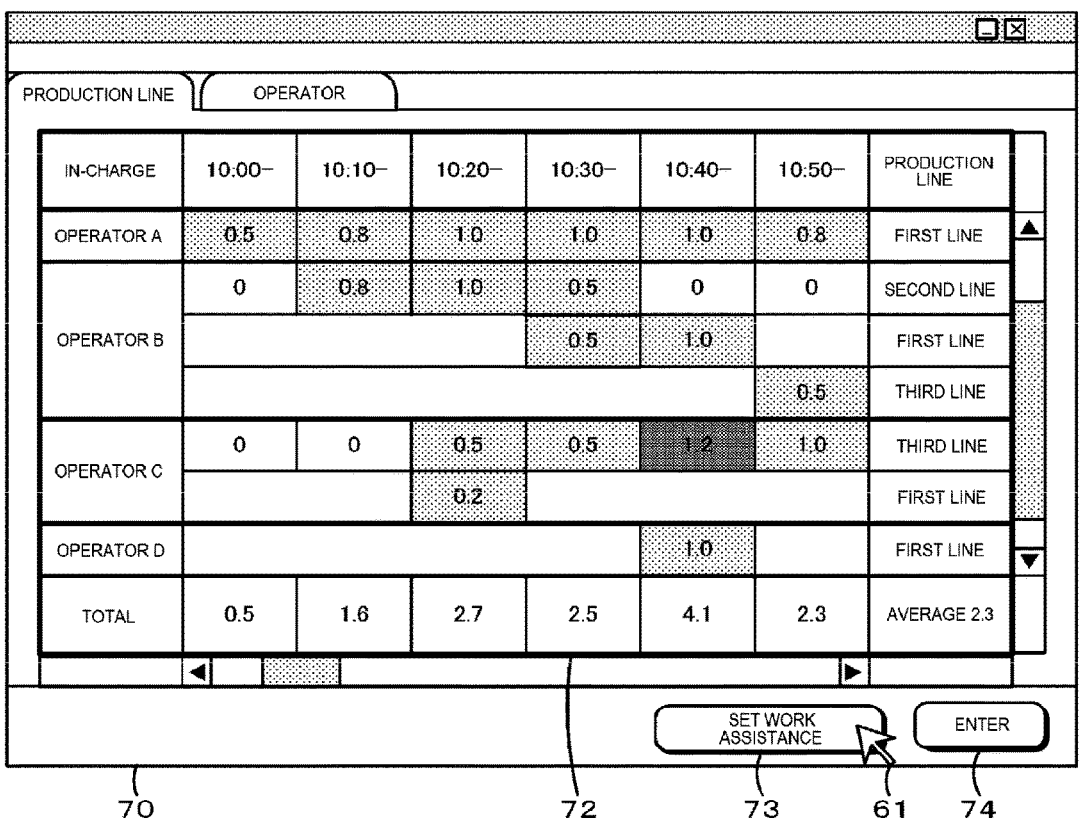
FIG. 9 A diagram showing an example of workload table display screen 70 after setting assistants.

On the other hand, when the display mode is the operator reference in S180, CPU 52 displays the workload table of the operator reference (S200). FIG. 8 is a diagram showing an example of the workload table display screen 70 of the operator reference, which is displayed on display section 59. Workload table display screen 70 includes cursor 61, workload table 72, set work assistance key 63, and enter key 64. Workload table 72 is a table in which the workload of operator M to be performed within the time block and the time block are linked for each operator. Aside from being displayed in terms of operators, workload table 72 is the same as workload table 62 of FIG. 6. After displaying workload table display screen 70, when set work assistance key 63 is pressed, CPU 52 displays the workload table after the change in which the assistant operator is set (S230), similarly to workload table display screen 60. FIG. 9 is a diagram showing an example of workload table display screen 70 after setting assistants. Aside from being displayed in terms of operators, workload table 72 after setting assistants is also the same as workload table 62 of FIG. 7.

After S230 or when the work assistance setting has not been entered in S210, CPU 52 determines whether termination of the process has been inputted (S240), and if the termination process has not been inputted, CPU 52 repeatedly executes the processes after S100. At this time, when it is time to update the workload table in S100, CPU 52 creates a workload table taking into account the production status. That is, CPU 52 acquires the production status information from the production line in operation and updates the workload table, currently performing a mounting process, based on the acquired production status information. For example, if a workload causes a delay in work several hours after the start of production, the amount of solder consumption and the amount of components consumed will change from the initial schedule. Here, by updating the workload table based on the production situation, operator M can understand what state the current workload is in. On the other hand, when an input for process termination is inputted in S240, CPU 52 terminates the routine as it is.

Here, the correspondence between the components of the present embodiment and the components of the present disclosure will be specified. Control section 51 of the present embodiment corresponds to a control section of the present disclosure, production job 54 corresponds to a production job, correspondence information 55 corresponds to correspondence information, assigned information 56 corresponds to assigned information, and workload tables 57, 62, 72 correspond to workload tables. In this embodiment, an example of the information processing method of the present disclosure is also disclosed by describing the operation of management PC 50.

Management PC 50 of the present embodiment described above obtains the workloads of operators M to be performed within a time block between the first point-in-time and the second point-in-time based on correspondence information 55, in which work contents are linked with working times of operators M required for the work contents, and production jobs 54 of the production lines. In addition, management PC 50 creates workload table 57 in which the obtained workloads are linked to the time blocks and displays the created workload table 57 on display section 59. Operator M can then check the outputted workload table 57. Therefore, in management PC 50, workload table 57 enables the workloads for each time period during which mounting processes are executed to be easily understood.

Mounting system 10 includes multiple production lines, and control section 51 creates workload table 62 in which workloads are linked to each production line. In this management PC 50, it is possible to easily determine, for each production line, the workloads for each time period during which a mounting process is executed. That is, operator M can determine which production line and in which time period, within all the production lines, the workload is large or small. Further, control section 51 creates workload table 72 in which workloads are linked to each operator based on assignment information 56 in which each operator M is linked to a device of mounting system 10 to which the operator is assigned. In this management PC 50, it is possible to easily determine the workloads for each operator M in each time period in which a mounting process is executed.

Further, control section 51 displays one or more of the time block workload within a predetermined workload range in which operator M works, the time block workload that is smaller than the predetermined workload range, and the time block workload that is larger than the predetermined workload range in different ways. In this management PC 50, it is easy to visually grasp in which time block the workloads are large and in which time block the workloads are small. Further, with multiple operators M in charge of mounting system 10, when there is a production line with a time block in which the workload is larger than the predetermined workload range, control section 51 selects operator M who has a workload smaller than the time block workload range and sets the selected operator M as an assistant operator of the production line in which the workload is larger than the predetermined workload range. In this management PC 50, the workloads can be equalized. Furthermore, control section 51 acquires the production status information from mounting system 10 during a mounting process and updates workload table 57 during the mounting process based on the acquired production status information. In this management PC 50, since the updated workload table 57 can be checked during a mounting process, it is possible to easily determine the workload corresponding to the present situation for each time period in which a mounting process is executed. Control section 51 also displays the average workload of the production lines. In this management PC 50, it is easy to determine the number of operators required for the production lines.

It should be noted that the information processing device and the information processing method of the present disclosure are not limited to the embodiments described above, and may be implemented in various modes as long as they fall within the technical scope of the present disclosure.

For example, in the embodiment described above, workload table 62 of the production line reference and workload table 72 of the operator reference are created and displayed, but only one of them may be created and displayed. This management PC 50 also makes it easier to determine the workload for each time period during which a mounting process is performed.

In the embodiment described above, the display mode of workload table 62 differs for within the predetermined workload range, smaller than the predetermined workload range, and larger than the predetermined workload range, but the present disclosure is not particularly limited thereto, and the change of any one or more display modes may be omitted. Further, in the embodiment described above, the workload is displayed as a numerical ratio, but the present disclosure is not particularly limited thereto, and the workload may be displayed as a ratio on a graph.

In the embodiment described above, an assistant operator is set when there is a production line in which a time block has a workload that is larger than the predetermined workload range, but the present disclosure is not particularly limited thereto, and the setting of the assistant operator may be omitted. When the workload table is displayed, it is possible to easily understand the workload for each time period in which a mounting process is executed.

In the embodiment described above, control section 51 displays the average workload of the production line on workload table 57, but the present disclosure is not particularly limited thereto, and may omit the average workload, or further display one or more of the maximum workload and the minimum workload. In this management PC 50, it is easy to determine the number of operators required for the production lines.

Here, the information processing device and the information processing method of the present disclosure may be configured as follows. In the information processing device of the present disclosure, the mounting system may include multiple production lines, and the control section may create a workload table in which workloads are linked to each production line. In this information processing device, it is possible to easily determine, for each production line, the workload for each time period in which a mounting process is executed. That is, the operator can determine which production line and in which time period, within all the production lines, the workload is large or small.

In the information processing device of the present disclosure, the control section creates the workload table in which the workloads are linked to each operator based on the assignment information in which the operator and the device of the mounting system assigned by the operator are linked. In this information processing device, it is possible to easily determine, for each operator, the workload for each time period in which a mounting process is executed.

In the information processing device of the present disclosure, the control section may display one or more of the time block workload within a predetermined workload range in which the operator works, the time block workload that is smaller than the predetermined workload range, and the time block workload that is larger than the predetermined workload range in different ways. In this information processing device, it is easy to visually understand in which time block the workload is high or in which time block the workload is low. Here, the "predetermined workload range" may be, for example, a range of working times suitable for normal work for the operator. This workload range may be, for example, a ratio of working time of the operator to the length of the time block, and may be a range from 20% to 80%, a range of 10% to 100%, and the like. Specifically, when the time block is 10 minutes and the working time is 10 minutes (100%), the workload is 1.0 and the operator can work within the time block. On the other hand, when the time block is 10 minutes and the working time is 15 minutes, the workload becomes 1.5, and it can be understood that the workload in the time block is high.

In the information processing device of the present disclosure, multiple operators are in charge of the mounting system, and when there is a production line with a time block in which the workload is larger than the predetermined workload range, the control section may select an operator who has a workload smaller than the time block workload range and may set the selected operator as an assistant operator of the production line in which the workload is larger than the predetermined workload range. In this information processing device, workloads can be equalized.

In the information processing device of the present disclosure, the control section may acquire production status information from the mounting system during a mounting process and may update the workload table during the mounting process based on the acquired production status information. In this information processing device, since the updated workload table can be checked during a mounting process, it is possible to easily determine the workload corresponding to the present situation for each time period in which a mounting process is executed.

In the information processing device of the present disclosure, one or more of the maximum workload and the minimum workload may be outputted. This information processing device makes it easier to determine the number of operators required for a production line.

The information processing method of the present disclosure is an information processing method, used in a mounting system composed of a production line comprising mounting devices configured to mount a component on a board, comprising: (a) a step of obtaining operator workload to be performed within a time block between a first point-in-time and a second point-in-time based on correspondence information linking work content and operator working time required for the work content, and the production job of the production line, and creating a workload table in which the operator workload is linked to the time block; and (b) a step of outputting the workload table created in step (a).

In this information processing method, similarly to the information processing device described above, since the operator can check the outputted workload table, the operator can easily determine the workload for each time period in which a mounting process is executed. In this information processing method, various modes of the information processing device described above may be employed, or a configuration for achieving each function of the information processing device described above may be added.

INDUSTRIAL APPLICABILITY

The present disclosure is applicable to the technical field of devices for picking up and mounting components.

REFERENCE SIGNS LIST

10 Mounting system, 11 First production line, 12 Second production line, 13 Third production line, 14 Network, 15 ID card, 16 Portable terminal, 20 Board supplying device, 21 Printing device, 22 Print inspection device, 23 Mounting device, 24 Mounting inspection device, 25 Reflow device, 26 Reflow inspection device, 28 Conveyance device, 31 Control section, 32 CPU, 33 Printing section, 34 Control section, 35 CPU, 36 Mounting section, 37 Control section, 38 CPU, 39 Reflow section, 41 Control section, 42 CPU, 43 Inspection section, 50 Management PC, 51 Control section, 52 CPU, 53 Storage section, 54 Production job, 55 Correspondence information, 56 Assignment information, 57 Workload table, 58 Input device, 59 Display section, 60 Workload table display screen, 61 Cursor, 62 Workload table, 63 Set work assistance key, 64 Enter key, 70 Workload table display screen, 72 Workload table, M Operator, S Board.

The invention claimed is:

1. An information processing device for use in a mounting system configured as a production line, including a component mounter configured to mount components on a board, the information processing device comprising:
    processing circuitry configured to:
        extract work sessions corresponding to a production job of the production line;
        calculate start times of the work sessions;
        obtain an operator workload to be performed within a time block between a first point-in-time and a second point-in-time based on correspondence information linking work content and operator working time required for the work content;
        create a workload table linking, the start times, the time block and the operator workload; and
        output the workload table,
    wherein multiple operators are in charge of the mounting system, and
    wherein, when there is a production line with a time block in which the operator workload is larger than a workload range, the processing circuitry selects the operator workload that has a workload smaller than the workload range of the time block, and sets a selected operator as an assistant operator of the production line, the operator workload of which being larger than the workload range.

2. The information processing device of claim 1, wherein the mounting system comprises multiple production lines, and the processing circuitry creates the workload table in which the operator workload is linked to each production line.

3. The information processing device of claim 2, wherein the processing circuitry creates the workload table, in which the operator workload is linked to each operator, based on assignment information in which the operators and devices of the mounting system assigned to each operator are linked.

4. The information processing device of claim 1,
    wherein the processing circuitry displays one or more of: the time block workload within the workload range in which the operator works, the time block workload that is smaller than the workload range, and the time block workload that is larger than the workload range.

5. The information processing device of claim 1,
    wherein the processing circuitry acquires production status information from the mounting system during a mounting process and updates the workload table during the mounting process based on the acquired production status information.

6. The information processing device of claim 2,
    wherein the processing circuitry outputs information of one or more of an average workload, a maximum workload, and a minimum workload of the production lines.

7. An information processing method, used in a mounting system composed of production lines, comprising component mounters configured to mount components on a board, the information processing method using processing circuitry configured to extract work sessions and create workload tables corresponding to production jobs of the production lines and comprising:
    calculating start times of the work sessions; obtaining operator workload to be performed within a time block between a first point-in-time and a second point-in-time based on correspondence information linking work content and operator working time required for the work content
    creating a workload table in which the operator workload is linked to the time block and the start times;
    outputting the workload table; and
    selecting the operator workload, of multiple operators are in charge of the mounting system, that has a workload smaller than the workload range of the time block, and sets a selected operator workload as an assistant operator of the production line, the operator workload of which being larger than the workload range when there is a production line with a time block in which the operator workload is larger than a workload range.

* * * * *